(12) United States Patent
Sternberg et al.

(10) Patent No.: US 7,201,582 B1
(45) Date of Patent: Apr. 10, 2007

(54) MICROSTRIP INTERCONNECTOR FOR SOLDERLESS CONNECTION

(75) Inventors: Steven L. Sternberg, Simi Valley, CA (US); Daniel P. Roman, Cerritos, CA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 11/439,917

(22) Filed: May 24, 2006

(51) Int. Cl.
*H01R 12/00* (2006.01)
*H05K 1/00* (2006.01)

(52) U.S. Cl. ........................................ 439/65
(58) Field of Classification Search ............... 439/65
See application file for complete search history.

(56) References Cited

U.S. PATENT DOCUMENTS 6,986,667 B2 * 1/2006 Chang et al. ............... 439/65

* cited by examiner

*Primary Examiner*—Javaid H. Nasri
(74) *Attorney, Agent, or Firm*—Leonard A. Alkov

(57) ABSTRACT

A microstrip interconnector includes a ground plane layer, a dielectric layer coupled to the ground plane layer and a spring conductor, and provides a solderless connection between circuit boards. The spring conductor has first and second rising arms with a midsection therebetween. The midsection couples to the dielectric layer opposite the ground plane layer, defining a first elevation. First and second contacts proximate distal ends of the first and second arms, respectively, define at least one second elevation. The solderless interconnection is for example provided when the ground plane layer, the dielectric layer and the spring conductor cooperatively interact to provide a matched impedance path from the first contact, proximate a microstrip of a first circuit board, to the second contact, proximate a microstrip of a second circuit board that is separated from the first circuit board by a gap. The microstrip interconnector thus facilitates the transfer of microwave signals between the separated microstrips.

33 Claims, 7 Drawing Sheets

Uniform infinite transmission line of characteristic impedance $R_0$

Equivalent circuit

Uniform semi-infinite transmission lines joined using wire bond connection

Wire bond connection modeled as inductive circuit element

Correlation between power transfer and impedance match
(Circuit values used for plot $R_{0,1} = R_{0,2} = R_0$, L=0.1)

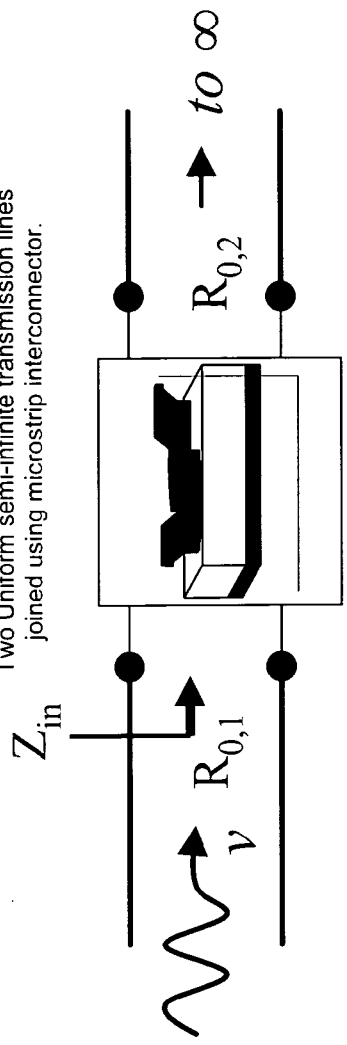
FIG. 9
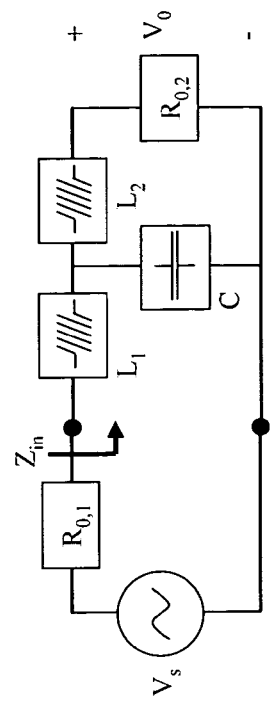
Microstrip interconnector functions electrically as a 3 element reactive low-pass circuit.
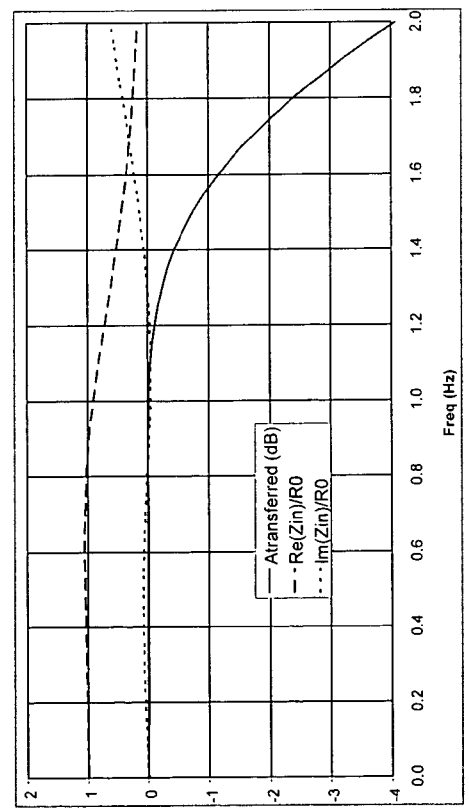
Correlation between power transfer and impedance match
(circuit values used for plot: R0,1=R0,2=R0=1, L1=L2=0.1001, C=0.1544).

MICROSTRIP INTERCONNECTOR FOR SOLDERLESS CONNECTION

This invention was made with Government support under Contract No. F33657-96-C-2061 awarded by the Department of the Air Force. The Government has certain rights in this invention.

FIELD

This invention relates generally to the field of radio frequency signal trace interconnections, and more specifically to a microstrip interconnector device used to solderlessly bridge across gaps in radio frequency signal traces of microstrip circuit boards.

BACKGROUND

In the electrical arts, a microstrip is recognized as a thin, flat electrical conductor separated from a ground plane by a layer of insulation (e.g., a dielectric). They are typically used in printed circuit designs where high frequency signals are routed from one part of the assembly to another with high efficiency and minimal signal loss, due to radiation. They are a class of electrical conductors commonly known as transmission lines. They have specific electrical properties that are determined by the conductor width and resistivity, spacing from the ground plane and the dielectric properties of the insulating layer.

With the growing complexity of electrical systems, such as for example radar systems, it is often desirable to fabricate different elements and/or subsystems on different circuit boards. Such separation of elements may reduce fabrication costs and permit fabrication flexibility, as well as enhance the opportunity for service and replacement of an element, should an improvement later be developed or a component malfunction.

To properly establish an interconnection between the microstrip of one board and that of another board, generally, a technician will employ the use of a specialized solderer/welder to establish a ribbon connection. The use of such a machine generally requires either that the boards to be interconnected are brought to the machine, or that the machine is portable enough to be brought to the circuit boards.

In addition, the use of such a machine generally requires a degree of specialized training on the part of the technician. Even with such training there is a possibility of damaging the neighboring components, given the temperatures involved in welding/soldering such an interconnection in place. Repeated service upon such an interconnection and/or one or more of the interconnected boards generally requires the removal of such a welded/soldered interconnection, which may further impose stress upon the components.

As such, maintenance, especially field maintenance, is not always easily performed as a technician and/or the requisite tools and machines may not be available. Damage to a single interconnection may render the entire system, such as a radar system, inoperable—a condition highly undesirable and potentially costly in terms of human life and equipment loss.

Hence, there is a need for a microstrip interconnector that overcomes one or more of the technical problems and physical vulnerabilities common to contemporary wire bond connectors.

SUMMARY

This invention provides a microstrip interconnector for providing a solderless connection.

In particular, and by way of example only, according to one embodiment of the present invention, provided is a microstrip interconnector for establishing a solderless connection. Specifically this microstrip interconnector provides a ground plane layer; a dielectric layer coupled to the ground plane layer and an S-shaped spring conductor. The S-shaped spring conductor has a first rising arm, a second rising arm and a midsection therebetween, each arm having a distal end. The midsection defines a first elevation and is coupled to the dielectric layer opposite from the ground plane layer. A first contact is proximate to the distal end of the first rising arm; and a second contact is proximate to the distal end of the second rising arm, the first contact and second contact defining at least one second elevation. The ground plane layer, the dielectric layer and the S-shaped conductor cooperatively interact to provide a matched impedance path from the first contact to the second contact.

In yet another embodiment, provided is a microstrip interconnector for establishing a solderless connection, including: a ground plane layer; a dielectric layer coupled to the ground plane layer; a serpentine spring conductor having a first section, a midsection and a second section; the midsection having a first offset portion at first end and a second offset portion at a second end, the second offsets parallel to the first offset and extending opposite from the first offset, the midsection first offset and second offset lying in a first plane and coupled to the dielectric layer opposite from the ground plane layer; the first section extending from the first offset, adjacent to the midsection and rising from the first plane, the first section having a distal end providing a first contact; the second section extending from the second offset, adjacent to the midsection and rising from the first plane, the second section having a distal end providing a second contact; the first and third contacts lying in at least one second plane; and wherein the ground plane layer, the dielectric layer and the serpentine spring conductor cooperatively interact to provide a matched impedance path from the first contact to the second contact.

BRIEF DESCRIPTION OF THE DRAWINGS

FIGS. 7 through 10 illustrates the issues of matched impedance; and

DETAILED DESCRIPTION

Before proceeding with the detailed description, it is to be appreciated that the present teaching is by way of example only, not by limitation. The concepts herein are not limited to use or application with a specific system or method for a solderless microstrip interconnector. Thus, although the instrumentalities described herein are, for the convenience of explanation, shown and described with respect to exemplary embodiments, it will be appreciated that the principles herein may be applied equally in other types of systems and methods involving microstrip interconnectors.

Figure 1:
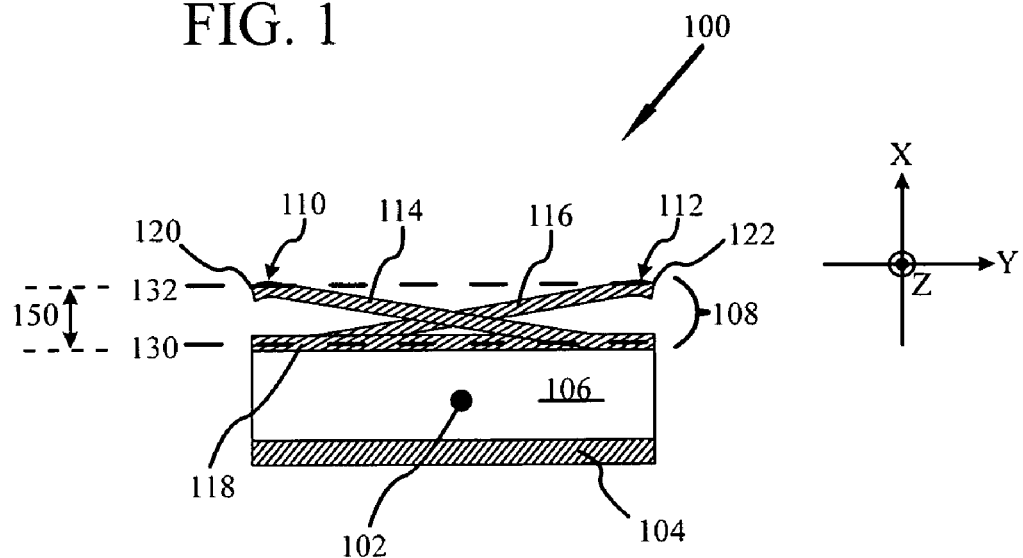
FIG. 1 is a side view of a microstrip interconnector, in accordance with an embodiment.

Referring now to the drawings, and more specifically FIGS. 1, 2, 3, 5 and 11, there is shown a microstrip interconnector (hereinafter "MI") 100 according to at least one embodiment. To facilitate the description of MI 100, the orientations of MI 100 as presented in the figures are referenced to the coordinate system with three axes orthogonal to one another, as shown in FIG. 1.

The axes intersect mutually at the origin of the coordinate system, which is chosen to locate at the center 102 of MI 100. The axes shown in all figures are offset from their actual locations, for clarity. Moreover, FIG. 1 is a side view defined by the X-axis and Y-axis.

Shown in FIG. 1, MI 100 has a ground plane layer 104, a dielectric layer 106 coupled to the ground plane layer 104, and a spring conductor 108 joined to the dielectric layer 106, opposite from the ground plane layer 104. The spring conductor 108 provides a first contact 110 and a second contact 112. As is further described below, the ground plane layer 104, the dielectric layer 106 and the spring conductor 108 cooperatively interact to provide a matched impedance path from first contact 110 to second contact 112.

Figure 2:
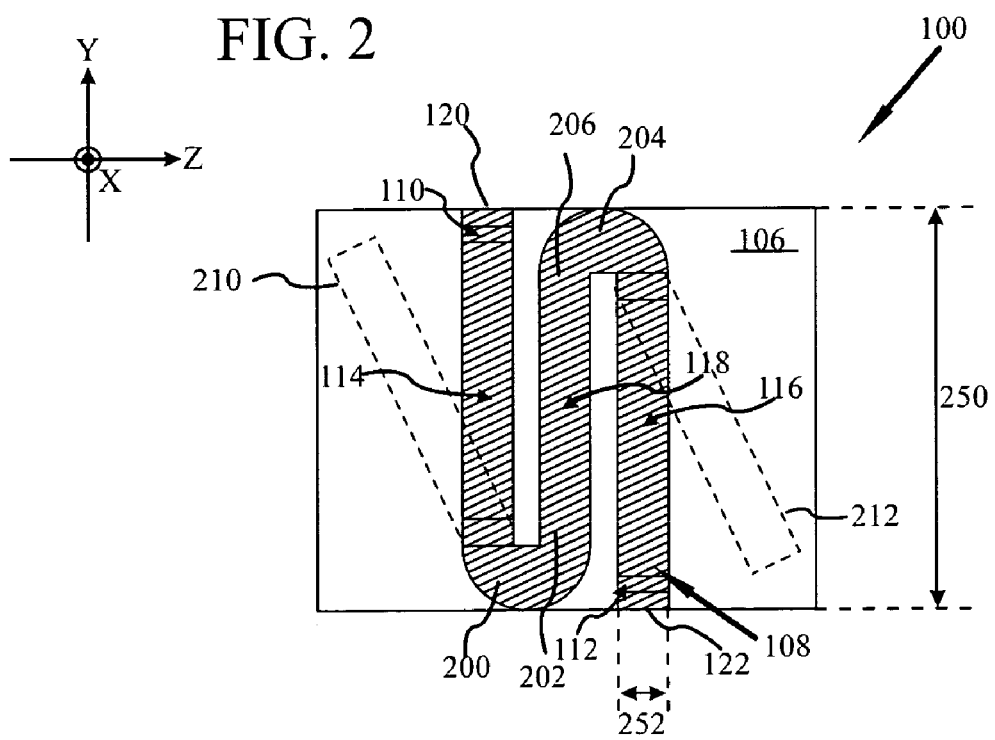
FIG. 2 is a top view of a microstrip interconnector, such as that in FIG. 1 or 3, in accordance with at least one embodiment.

As may be more fully appreciated with respect to FIG. 2, showing a top view of MI 100, e.g., defined by the Y-axis and Z-axis, in at least one embodiment, spring conductor 108 is a serpentine spring conductor 108. In at least one specific embodiment, spring conductor 108 is substantially an S-shaped spring conductor 108.

With respect to FIGS. 1 and 2, S-shaped spring conductor 108 is appreciated to have a first rising arm 114, a second rising arm 116 and a midsection 118 therebetween. Rising arm 114 has a distal end 120, and similarly rising arm 116 has a distal end 122. First contact 110 is proximate to distal end 120, and second contact 112 is proximate to distal end 122.

As is further appreciated in FIG. 1, midsection 118 defines a first elevation 130, and midsection 118 is joined to dielectric layer 106. More specifically, midsection 118 is inseparably joined to dielectric layer 106. First rising arm 114 is rising away from first elevation 130, and likewise second rising arm 116 is rising away from the first elevation 130, such that first and second contacts 110, 112 define at least one second elevation 132.

As shown, first and second contact points 110, 112 are defining the same second elevation 132. However as the spring properties of each rising arm 114, 118 permit independent movement of first and second contact points 110, 112 generally along the X-axis, it is understood and appreciated that first and second contact points 110, 112 may each define a different elevation separate from first elevation 130.

With respect to FIG. 2, midsection 118 is appreciated as having a first offset portion 200 at a first end 202 and a second offset portion 204 at a second end 206. Second offset 204 is parallel to and extends in the opposite direction from first offset 200. The midsection 118, first offset 200 and second offset 204 lie at the same elevation, e.g., elevation 130 as shown in FIG. 1. The midsection 118, first offset 200 and second offset 204 are joined to the dielectric layer 106.

Still in respect to FIG. 2, in at least one embodiment, a first section, e.g. first arm 114, extends parallel to the midsection 118 from the first offset towards the second end 206. This first section, e.g., first arm 114, rises from the first elevation as it extends from the first offset 200 to the distal end 120, to which first contact 110 is proximate. Similarly, a second section, e.g., second arm 116, extends parallel to the midsection 118 from the second offset towards the first end 202. This second section, e.g., second arm 116, also rises from the first elevation as it extends from the second offset 204 to the distal end 122, to which second contact 112 is proximate.

As shown, in at least one embodiment, first arm 114 and second arm 116 are substantially parallel to one another, each extending in the opposite direction. Further, as shown, first arm 114 and second arm 116 are parallel to midsection 118. As shown in the figures, in at least one embodiment, the first arm 114, second arm 116 and midsection 118 are approximately equal in length.

It is further understood and appreciated that in at least one alternative embodiment, first arm 114 and second arm 116 are again substantially parallel to one another, each extending in the opposite direction, however they are transverse to the midsection 118. Such a configuration is represented by dotted lines 210 and 212 suggesting an angled orientation of first and second arms 114, 116 with respect to midsection 118.

Spring conductor 108 may also be formed from multiple layers. It is understood and appreciated that as a matter of fabrication, such as by material deposition, multiple layers of material may form what is otherwise identified as a single layer, for ease of illustration and discussion. The spring conductor 108 as shown in FIG. 1 is understood and appreciated to be a unitary structure composed of an inseparable layer of material.

Figure 3:
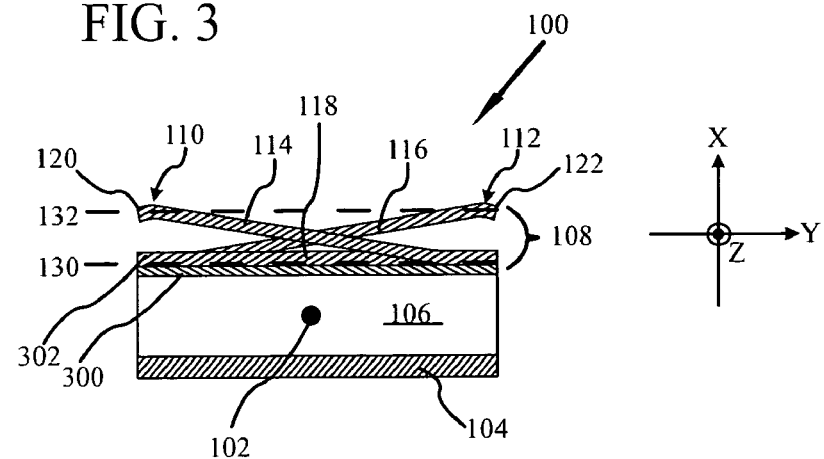
FIG. 3 is a side view of an alternative microstrip interconnector, in accordance with an embodiment.
Figure 4:
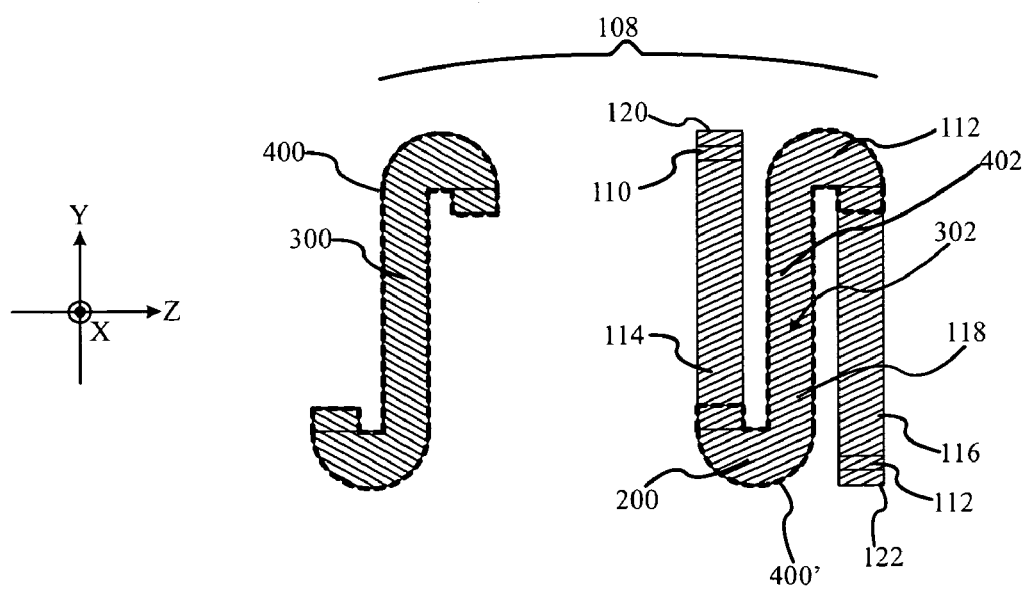
FIG. 4 is an exploded top view of the spring conductor in FIG. 3, in accordance with an embodiment.

Spring conductor 108 may also be formed from multiple layers that are clearly identifiable, such as for example the two layer structure illustrated in FIG. 3. As shown, there is a first layer 300 and a second layer 302. These layers may be further appreciated in FIG. 4. First layer 300 is shown having a first geometry 400, illustrated by dotted line. The second layer 302 has a middle portion 402 matching to the first geometry 400, e.g., 400'. The second layer 302 further provides the first arm 114 and the second arm 116.

In at least one embodiment, first layer 300 is described as being an S-shaped layer having truncated arms. More specifically, the arms are substantially shorter than midsection of first layer 300. In such an embodiment, second layer 302 is also described as being an S-shaped layer, having a middle portion 402 that matches to the first layer 300. For ease of illustration, in at least one embodiment the first geometry 400 of the first layer is shown as being S-shaped with truncated arms. The middle portion 402 of the second layer 302 matches to the first geometry 400, e.g., 400'.

In an alternative embodiment, although the spring conductor 108 may be described as a multi layer structure, first layer 300 is not considered part of the spring conductor. First layer 300 is still described as being S-shaped having truncated arms or as having a first geometry 400 that matches to the midsection 118 of spring conductor 108. First layer 300 serves to join spring conductor 108 to the dielectric layer 106.

In at least one embodiment, first layer 300 is a layer of adhesive of sufficient thickness and bonding strength to bond second layer 302 to dielectric layer 106. In at least one alternative embodiment, first layer 300 is a layer of solder of sufficient thickness to bond second layer 302 to dielectric layer 106.

Figure 6:
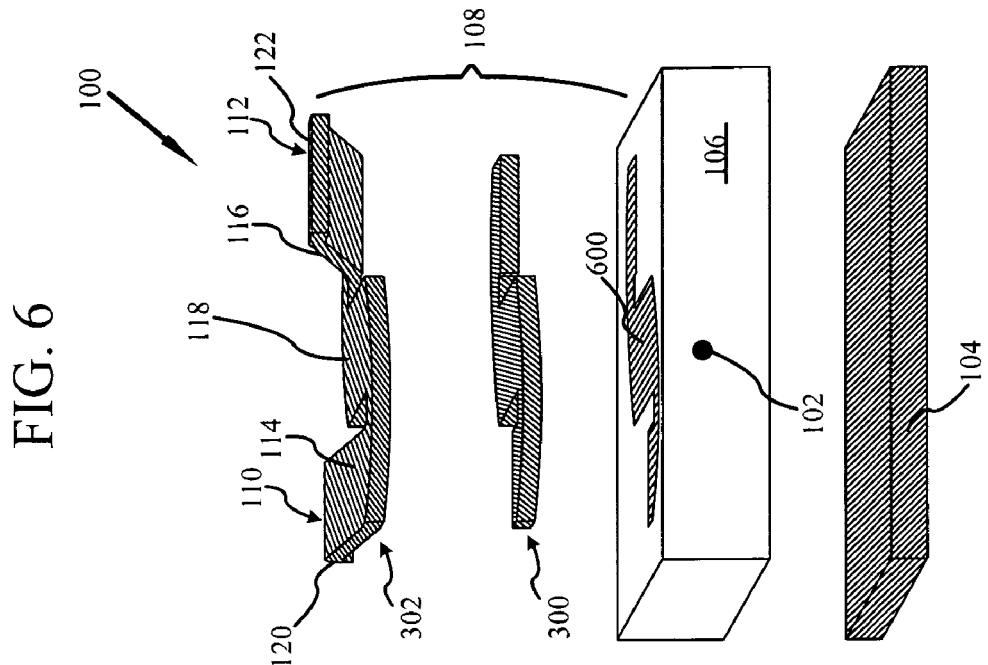
FIG. 6 is an exploded perspective view of the microstrip interconnector shown in FIG. 5 in accordance with an embodiment.
Figure 5:
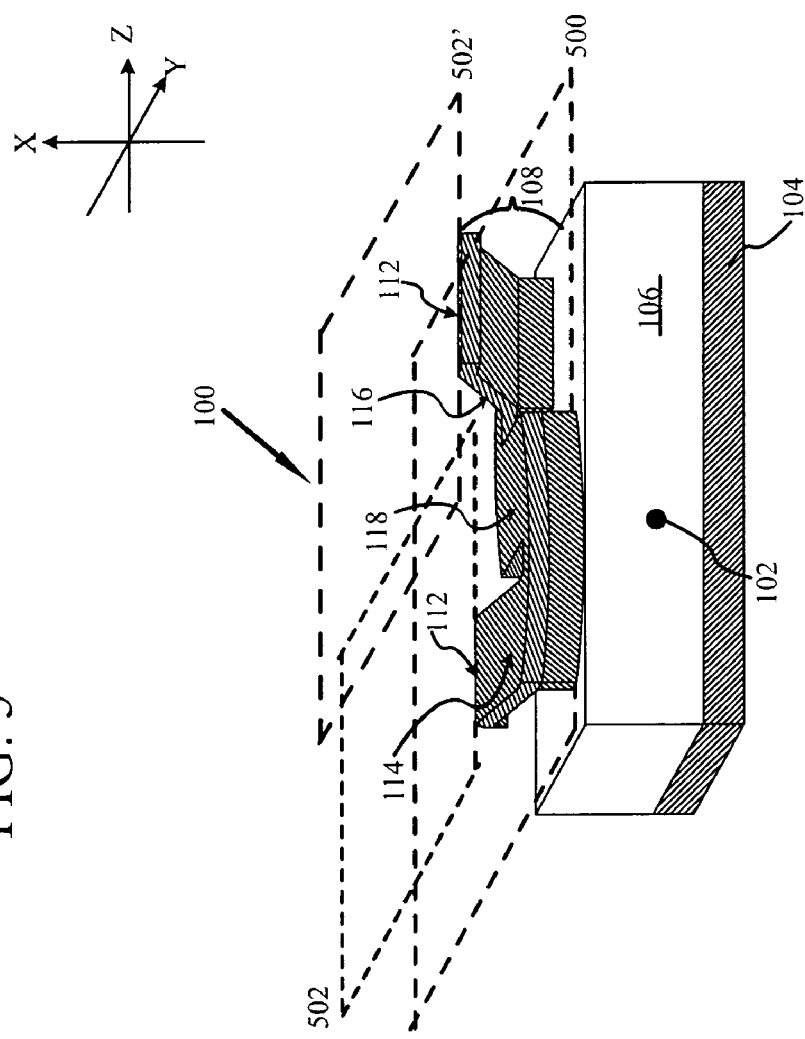
FIG. 5 is a perspective view of the microstrip interconnector shown in FIG. 3, in accordance with an embodiment.

FIG. 5 is a perspective view of MI 100, and FIG. 6 is a exploded view of the component structures which collectively provide MI 100. With respect to FIGS. 5 and 6, the nature of the spring conductor 108, and more specifically that first and second arms 114, 116 rise above midsection 118, is further appreciated. Moreover, it is appreciated that the first elevation of the midsection 118 lies in a first plane 500. First contact 110 and second contact 112 define at least one second elevation, as indicated in FIGS. 1 and 3. As shown in the perspective view of FIG. 5 first contact 110 is at an elevation defining at least one second plane 502 that is parallel to and removed from the first plane 500. Second contact is at an elevation defining plane 502' which is also parallel to and removed from the first plane 500. Indeed while the planes containing first contact 110 and second contact 112 may be co-planar, these planes are not co-planer with first plane 500.

In the exploded view of FIG. 6, it is also possible to see that in at least one embodiment, there is a thin layer of material 600, such as copper foil disposed upon the dielectric layer 106 that has been patterned to match to the midsection 118 of spring conductor 108, or the first layer 300.

In at least one embodiment, dielectric layer 106 is a 0.030" thick Arlon 25 N dielectric layer. Such a layer may be provided with a copper foil layer adhered to at least one side during part of the dielectric layer 106 manufacturing process. The use of photolithography is well known and may be used to pattern the adhered copper foil layer to provide a mounting spot conforming to the first geometry 400.

Generally speaking, assuming the copper foil layer is present upon the dielectric layer 106, a photo-resist layer, also commonly known simply as a photoresist, or even resist, is then applied, typically with a spin coating machine. A mask is then placed over the photoresist and light, typically ultra-violet (UV) light, is applied. During the process of exposure, the photoresist undergoes a chemical reaction. Generally, the photoresist will react in one of two ways.

With a positive photoresist, UV light changes the chemical structure of the exposed photoresist so that it is soluble in a developer, while the unexposed portions of the photoresist (those areas shadowed by the mask) remain resilient to the developer. Stated simply, what "shows" therefore "goes," and the mask provides an exact copy of the pattern that is to remain. A negative photoresist behaves in the opposite manner—UV exposure causes it to polymerize and therefore resist dissolving by the developer. As such, the mask is a photographic negative of the pattern to be left. Following the developing process, "blocks" of photoresist remain, and in the instant case of MI 100, protect the copper foil in an area that will serve to bond the spring conductor 108 to the dielectric layer 106. An etching process is then performed to remove the exposed copper foil, following which the remaining resist is also removed to exposed material 600 (e.g., copper foil) conforming in at least one embodiment to the first geometry 400.

Spring conductor 108 is a conductive material, and in at least one embodiment is formed from a beryllium copper alloy sheet having a thickness of approximately three thousandths of an inch. Those skilled in the art will understand a variety of fabrication techniques for rendering a spring element from a conductive sheet of metal, including but not limited to etching, cutting and stamping.

In at least one embodiment the resulting spring conductor has dimensions of approximately between 0.1" to 0.25" in length 250, a width 252 of approximately between 0.015" to 0.035" for each first arm 114, second arm 116 and midsection 118, and a thickness (e.g. height) for each approximately between 0.001" to 0.005". Further, in at least one embodiment the resulting spring conductor has dimensions of approximately 0.180" (approximately 4.57 mm) in length 250, a width 252 of approximately 0.0225" (approximately 0.572 mm) for each first arm 114, second arm 116 and midsection 118, and a thickness (e.g. height) for each of approximately 0.003" (approximately 0.076 mm), see FIG. 2.

As shown in FIG. 1, the elevation rise 150 of the first arm 114 and second arm 116 is approximately 0.011" at nominal compression. Such a configuration results in a spring conductor 108 having an effective stress for each first arm 114 and second arm 116 that is about 80 ksi, a value that is significantly less than the material yield strength of 145 ksi for a 0.003" beryllium copper alloy sheet. Indeed, the maximum deflection along the length of either the first arm 114 or the second arm 116 is approximately 0.013" (33.02 mm).

As indicated above, the dielectric layer 106, spring conductor 108 and ground plane layer 104 cooperatively interact to provide a matched impedance path from the first contact 110 to the second contact 112. Stated simply, this is understood to imply that no signal is lost in transmission from first contact 110 to second contact 112. Establishing a matched impedance path is highly desirable, for in signal processing it is generally of paramount importance to deliver signals between areas of the processing environment with as little alteration, transformation or degradation as possible.

Moreover, to process the signal it is generally of significant importance to know when and how the signal is modified or altered, and to avoid the opportunity for unintended and unaccounted for modification or degradation. In layman's terms, a matched impedance path is therefore understood and appreciated to suggest that a signal provided to first contact 110 will be delivered to second contact 112 without significant change, and vice versa.

Figure 7:
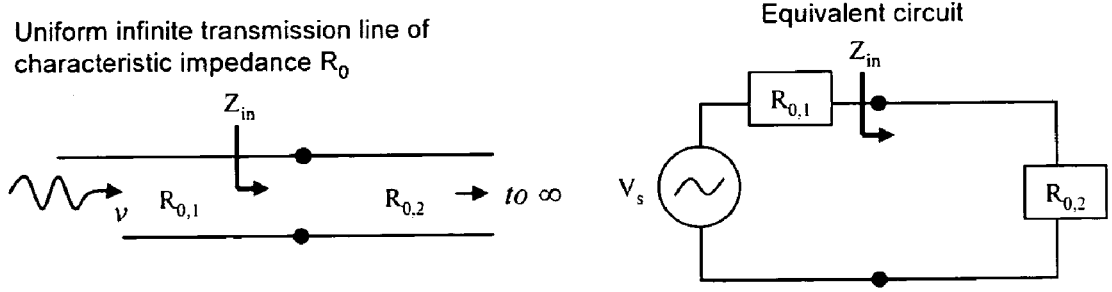

FIGS. 7 through 10 present illustrations to further assist in a high level overview of matched impedance. More specifically, a simple way to convey the importance of impedance matching in transmission lines such as a microstrip, is to consider the power transfer at the junction of two contiguous semi-infinite lengths of uniform lossless transmission line, as shown in FIG. 7. The quality of uniform lossless transmission lines that is of interest is that of characteristic impedance, a property derived from the line's cross-sectional geometry and of the type and distribution of dielectric material used in the line's physical construction.

Characteristic impedance is denoted herein as $R_0$. It is commonly understood that lossless transmission lines possess a characteristic impedance that is purely real, i.e., containing no reactive component. Allowing the two transmission lines to have arbitrary independent characteristic impedances, these impedances are denoted as $R_{0,1}$ and $R_{0,2}$. An idealized equivalent circuit of the transmission line junction is also shown in FIG. 7. Energy transfer across the transmission line junction relates directly to the proportion of energy absorbed in resistor $R_{0,2}$ to the total energy expended in the equivalent circuit.

It can be shown that the energy into $R_{0,2}$ is maximized for fixed values of $R_{0,1}$ and $V_s$ when the two resistors ($R_{0,1}$ and $R_{0,2}$) are of equal value. That is, maximum available power:

$$P_{max} = |V_s|^2 / 4R_{0,1}$$

is transferred to $R_{0,2}$ when $R_{0,1}$ and $R_{0,2}$ are matched in value. Therein lies the importance of matching impedances, also known as impedance matching, in high frequency circuits. Note that this condition of maximum power transfer occurs when the impedance $Z_{in}$ into the junction seen by the incident energy is equal to, or matched with, the characteristic impedance of the transmission line carrying the incident energy to the junction.

Figure 8:
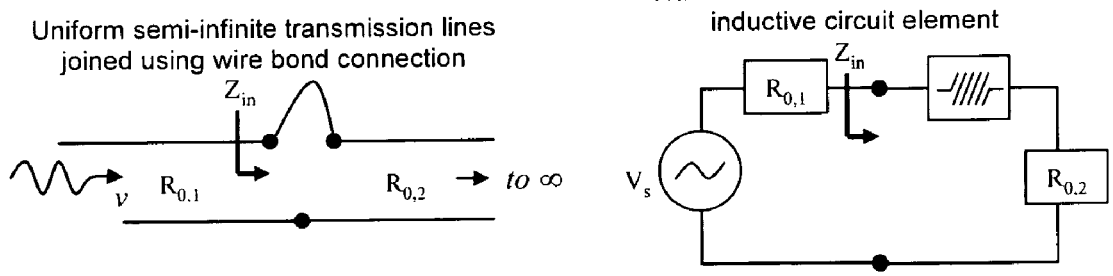
Figure 8:
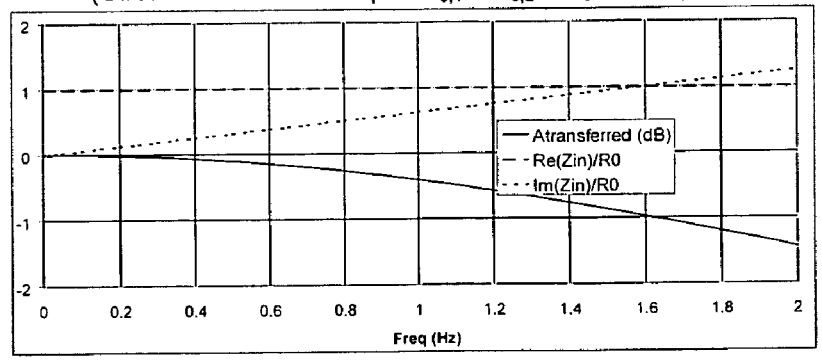

FIG. 8 illustrates a wire bond junction joining two lossless and impedance matched transmission lines. The wire bond junction is idealized in the equivalent circuit by an inductor of inductance L. The proportion of incident power transferred across the wire bond junction can be found from its equivalent circuit. The power transferred across the inductor to impedance $R_{0,2}$ is found to be:

$$P_{transferred} = \frac{|V_s|^2 R_{0,1}}{(R_{0,1} + R_{0,2})^2 + (wL)^2}$$

The ratio of power transferred to the maximum available power is given for matched impedance transmission lines by:

$$A_{transferred} = P_{transferred} / P_{max}$$

$$= \frac{1}{\left(\frac{1}{2} + \frac{R_{0,2}}{2R_{0,1}}\right)^2 + \left(\frac{wL}{2R_{0,1}}\right)^2}\Bigg|_{R_{0,1}=R_{0,2}=R_0}$$

$$= \frac{1}{1 + \left(\frac{wL}{2R_0}\right)^2}$$

As shown in the graph of FIG. 8, as the impedance $Z_{in}$ deviates from the matched impedance condition $Z_{in} = R_0$, $A_{transferred}$ decreases monotonically from its maximum $A_{transferred} = 1$. Values used for $R_0$ and L are 1 and 0.1, respectively.

The microstrip interconnector of FIG. 9 is substantially identical to MI 100 as described above, and provides a low loss matched impedance path to the neighboring transmission line in a manner similar to that provided by an ideal three element low-pass filter. Voltage gain $A_v = V_0/V_s$ is given by:

$$A_v = A_{st} \frac{R_{0,2}}{R_{0,2} + Z_{th}}$$

where $A_{st} = \frac{1}{1 - w^2 L_1 C + jwR_{0,1}C}$, $$Z_{th} = jwL_2 + \frac{R_{0,1} + jwL_1}{1 - w^2 L_1 C + jwR_{0,1}C}$$

$P_{transferred}$, $A_{transferred}$ and $Z_{in}$ are then given by:

$$P_{transferred} = A_v A_v^*, \quad A_{transferred} = P_{transferred}/P_{max}, \text{ and}$$

$$Z_{in} = jwL_1 + \frac{R_{0,2} + jwL_2}{1 - w^2 L_2 C + jwR_{0,2}C}$$

With $R_{0,1} = R_{0,2} = R_0$, proper selection of reactive components L1, L2, and C provide a flat power transfer to $R_{0,2}$ that approaches $P_{max}$ that is, $A_{transferred}$ approaches 1, over a maximum bandwidth. This corresponds to $Z_{in}$ being closely matched to $R_0$, that is:

$$Re(Z_{in}) \approx R_0, Im(Z_{in}) \approx 0$$

The graph of FIG. 9 shows electrical performance of a typical 3 element low pass circuit with circuit response plotted for $L_1 = L_2 = 0.1001$, $C = 0.1544$, and characteristic impedance $R_0 = 1$. The microstrip interconnector (e.g. MI 100) implements inductors $L_1$ and $L_2$ as distal arms, e.g. 114, 116, and capacitor C as the center metallic section and dielectric block. Comparing the graphs of FIGS. 8 and 9, it is seen that implementation of MI 100, as a multi-element filter allows for much flatter power transfer performance for a given elemental inductance value than can be had with a wire bond interconnect.

Figure 10:
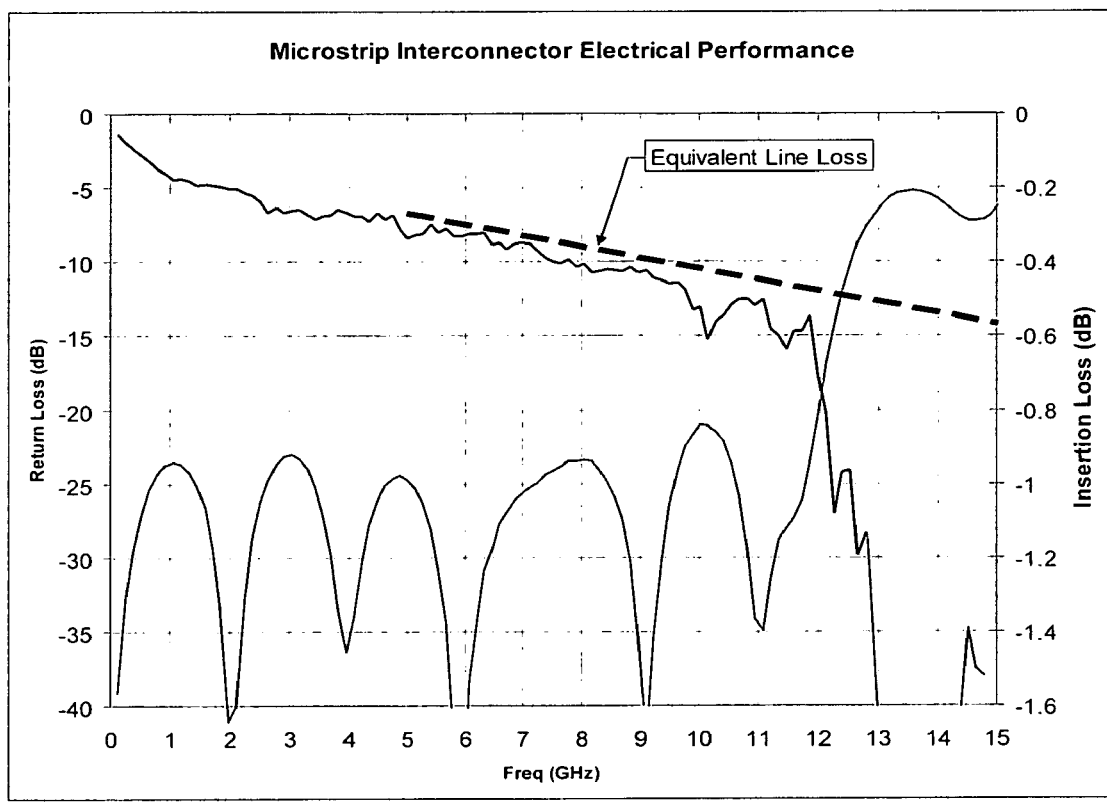

FIG. 10 presents a graph of the measured power transfer of an implementation of MI 100. Represented as insertion loss in decibels, and measured $Z_{in}/R_0$, measured as return loss in decibels, the graph follows closely the performance trends shown in the low pass filter model shown in the graph of FIG. 9, supporting the three element filter circuit model as a valid representation of the microstrip interconnector.

Returning to the figures, in at least one embodiment, ground plane layer 104 is inseparably joined to the dielectric layer 106 opposite from the spring conductor 108, see for example FIG. 3. In an alternative embodiment, the ground plane layer 104 may be coupled to the dielectric layer 106 by an external holding force, such as an outer cover (not shown) that presses the ground plane layer 104 against the dielectric layer 106. In yet another embodiment, the ground plane layer 104 is an integral part of an outer cover (not shown). The cover may also provide alignment features that serve to align MI 100 and at least one circuit board, so as to establish a proper interconnection.

Figure 11:
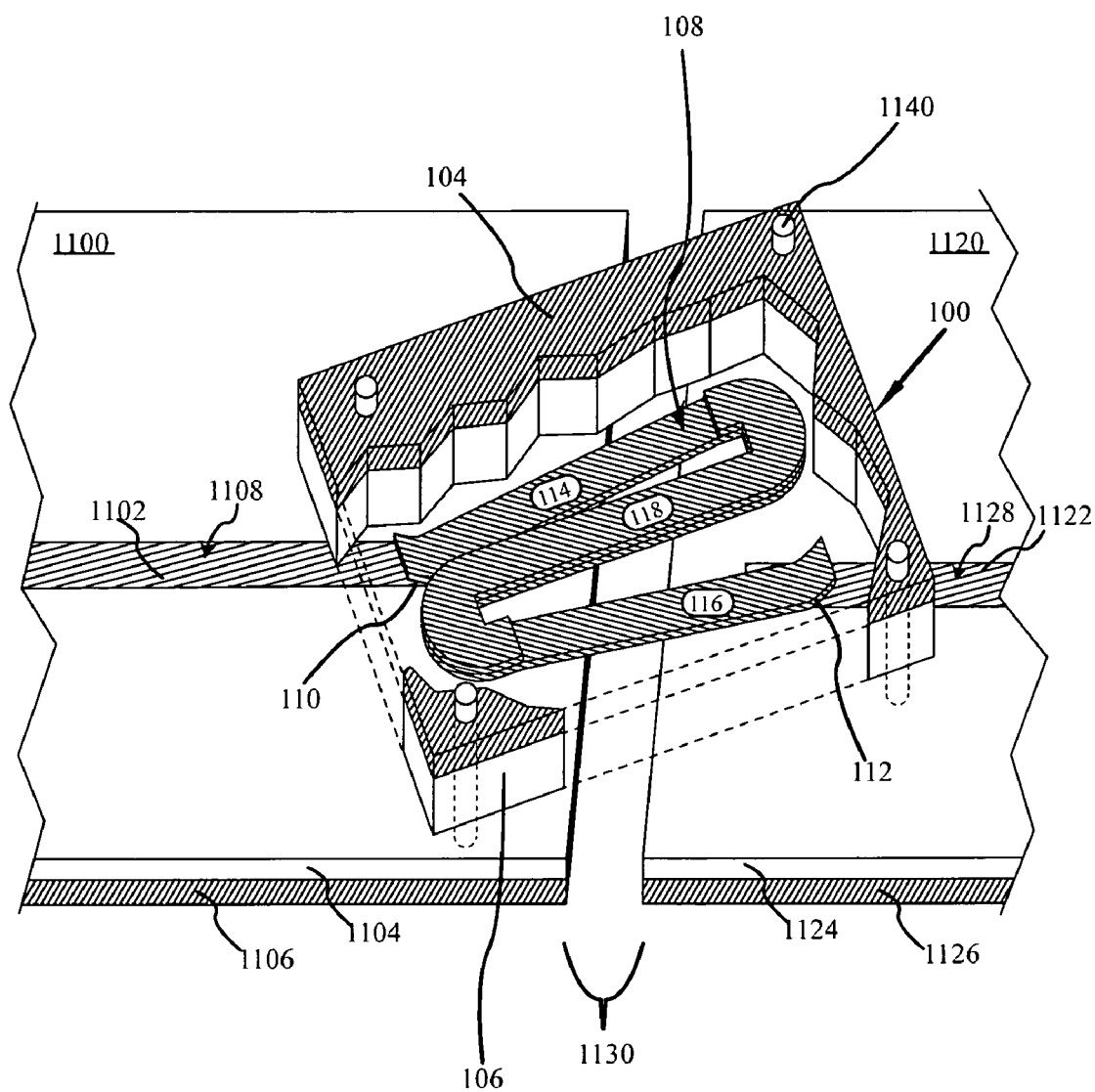
FIG. 11 is a perspective partial cutaway view of the microstrip interconnector of FIG. 5 interconnecting two circuit boards, in accordance with an embodiment.

FIG. 11 illustrates a perspective view and partial cutaway of MI 100 employed to interconnect two printed circuit boards. Specifically, printed circuit board 1100 provides a conductive trace 1102 upon a dielectric layer 1104 and a ground plane layer 1106 opposite from the conductive trace 1102. The conductive trace 1102, dielectric layer 1104 and ground plane layer 1106 effectively provide microstrip 1108 on circuit board 1100, which is suitable for microwave transmission.

Likewise, second printed circuit board 1120 provides a conductive trace 1122 upon a dielectric layer 1124 and a ground plane layer 1126 opposite from the conductive trace 1122. The conductive trace 1122, dielectric layer 1124 and ground plane layer 1126 effectively provide microstrip 1128 on circuit board 1120 which is suitable for microwave transmission.

The spring conductor 108, dielectric layer 106 and ground plane layer 104 of MI 100 cooperatively interact to provide matched impedance path from first contact 110 to the second contact 112 and thus permit MI 100 to bridge the gap 1130 between circuit board 1100 and circuit board 1120 for the transfer of the microwave signal from microstrip 1108 to microstrip 1128. More specifically, MI 100 establishes a solderless interconnection between circuit board 1100 and circuit board 1120.

With respect to FIG. 11, in at least one embodiment, ground plane layer 104 is an incorporated element of a greater cover, not shown. Pins 1140 therefore not only serve to align and attach MI 100 to circuit boards 1100 and 1102, but also affix the cover in place for overall protection of all enclosed components.

MI 100 is not soldered in place, rather it is held in place, such as, for example, by a releasable attaching device. In at least one embodiment this may accomplished with the use of conductive pins. Specifically, pins 1140 hold MI 100 to printed circuit boards 1100, 1120, and further interconnect the ground plane layers 1106, 1126 of the circuit board 1100, 1120 with the ground plane layer 104 of MI 100.

As MI 100 is not soldered in place, MI 100 may advantageously be removed or installed by a field technician without the use of machines to weld, solder or otherwise interconnect the microstrips of one circuit board with another. Such machines generally require training on the part of the technician, the degree of training for the installation and/or removal of MI 100 being significantly less. In addition, where such interconnections are soldered, welded or otherwise permanently established, the process of disassembly may damage one or more of the circuit boards, as well as require additional specialized training on the part of the technician.

Moreover, resistant spring tension of the first and second arms 114, 116 when under load achieves the interconnection between the first and second contacts 110, 112 and the microstrips 1108, 1128 of the associated circuit boards 1100, 1120. Nonlinear structural analysis of the serpentine spring conductor has confirmed the shape to be advantageously superior over a configurations, such as for example a spring conductor having a longitudinal axis following a portion of an ellipsis between the first contact and the second contact, in load vs. deflection. Reducing the deflected load is advantageously desirable for among other things, to prolong the useful life of MI 100.

Further, it is appreciated that the geometric structure of MI 100 and the spring levels provided by first and second arms 114, 116 permits the circuit boards (e.g., circuit boards 1100, 1120) to vary in size and spacing while still providing a matched impedance path when establishing an interconnection.

As the spring elements achieved in first arm 114 and second arm 116 enjoy an effective stress that is well below the sheer stress of the material composing the spring conductor 108, it is understood and appreciated that MI 100 may be installed and removed repeatedly without imposing significant wear upon the circuit boards 1100, 1120, or undergoing significant wear itself. Indeed, in a system employing a plurality of MIs 100 it is foreseeable that in an emergency situation, an unskilled person could remove an MI 100 from a non-critical interconnection and use it to replace a damaged MI 100 required for a critical interconnection.

Changes may be made in the above methods, systems and structures without departing from the scope hereof. It should thus be noted that the matter contained in the above description and/or shown in the accompanying drawings should be interpreted as illustrative and not in a limiting sense. The following claims are intended to cover all generic and specific features described herein, as well as all statements of the scope of the present method, system and structure, which, as a matter of language, might be said to fall therebetween.

What is claimed is:

1. A microstrip interconnector for providing a solderless connection, comprising:
    a ground plane layer;
    a dielectric layer coupled to the ground plane layer;
    a spring conductor having;
    a first rising arm, a second rising arm and a midsection therebetween, the midsection defining a first elevation and coupled to the dielectric layer opposite from the ground plane layer;
    a first contact proximate to the distal end of the first rising arm;
    a second contact proximate to the distal end of the second rising arm, the first contact and second contact defining at least one second elevation; and
    wherein the ground plane layer, the dielectric layer and the spring conductor cooperatively interact to provide a matched impedance path from the first contact to the second contact.

2. The microstrip interconnector of claim 1, wherein the spring conductor is a serpentine spring conductor.

3. The microstrip interconnector of claim 1, wherein the spring conductor is an S-shaped spring conductor.

4. A microstrip interconnector for providing a solderless connection, comprising:
    a ground plane layer;
    a dielectric layer coupled to the ground plane layer;
    an S-shaped spring conductor having:
    a first rising arm, a second rising arm and a midsection therebetween, each arm having a distal end, the midsection defining a first elevation and coupled to the dielectric layer opposite from the ground plane layer;
    a first contact proximate to the distal end of the first rising arm;
    a second contact proximate to the distal end of the second rising arm, the first contact and second contact defining at least one second elevation; and
    wherein the ground plane layer, the dielectric layer and the S-shaped conductor cooperatively interact to provide a matched impedance path from the first contact to the second contact.

5. The microstrip interconnector of claim 4, further including a releasable attaching device to latch the microstrip interconnector to at least one circuit board.

6. The microstrip interconnector of claim 4, wherein the first arm, second arm and midsection are parallel, the first arm and second arm extending in opposing directions.

7. The microstrip interconnector of claim 4, wherein the first and second arms are parallel and extend in opposing directions, the first and second arms transverse to the midsection.

8. The microstrip interconnector of claim 4, wherein the ground plane layer is removable from the dielectric layer.

9. The microstrip interconnector of claim 4, wherein the ground plane layer is inseparably joined to the dielectric layer.

10. The microstrip interconnector of claim 4, wherein the first rising arm, the second rising arm and the midsection are approximately equal in length.

11. The microstrip interconnector of claim 10, wherein the first rising arm, the midsection and the second rising arm each have approximately equal width.

12. The microstrip interconnector of claim 4, wherein the length of the first rising arm, the second rising arm and the midsection is approximately between 0.1 to 0.25 inch, the width of the first rising arm, the second rising arm and the midsection is approximately between 0.015 to 0.035 inch, and the thickness of the first rising arm, the second rising arm and the midsection is approximately between 0.001 to 0.005 inch.

13. The microstrip interconnector of claim 12, wherein the length of the first rising arm, the second rising arm and the midsection is approximately 0.180 inch, the width of the first rising arm, the second rising arm and the midsection is approximately 0.0225 inch, and the thickness of the first rising arm, the second rising arm and the midsection is approximately 0.003 inch.

14. The microstrip interconnector of claim 4, wherein the dielectric layer is an Arlon 25N dielectric carrier having a thickness of approximately 0.030 inch.

15. The microstrip interconnector of claim 4, wherein the microstrip interconnector is operable to establish a solderless connection between a first microstrip provided by a first circuit board and a second microstrip provided by a second circuit board, the first and second circuit boards separated by a gap.

16. The microstrip interconnector of claim 4, further including a first S-shaped layer having truncated arms joined to the dielectric layer, the midsection of the S-shaped spring conductor joined in alignment to the first s-shaped layer.

17. The microstrip interconnector of claim 4, wherein the S-shaped spring conductor is a multi layered structure, further including:
  a first S-shaped layer having truncated arms joined to the dielectric layer; and
  a second S-shaped layer having a midsection matched to the first S-shaped layer and joined in alignment to the first S-shaped layer, the second S-shaped layer having a first extended arm providing the first rising arm and a second extended arm providing the second rising arm.

18. A microstrip interconnector for providing a solderless connection, comprising:
  a ground plane layer;
  a dielectric layer coupled to the ground plane layer;
  a serpentine spring conductor having a first section, a midsection and a second section;
    the midsection having a first offset portion at a first end and a second offset portion at a second end, the second offset parallel to the first offset and extending opposite from the first offset, the midsection first offset and second offset lying in a first plane and coupled to the dielectric layer opposite from the ground plane layer;
    the first section extending from the first offset, adjacent to the midsection and rising from the first plane, the first section having a distal end providing a first contact;
    the second section extending from the second offset, adjacent to the midsection and rising from the first plane, the second section having a distal end providing a second contact;
    the first and second contacts lying in at least one second plane; and
  wherein the ground plane layer, the dielectric layer and the serpentine spring conductor cooperatively interact to provide a matched impedance path from the first contact to the second contact.

19. The microstrip interconnector of claim 18, wherein the first section, second section and midsection are parallel, the first section and second section extending in opposing directions.

20. The microstrip interconnector of claim 18, wherein the first and second sections are parallel and extend in opposing directions, the first and second sections transverse to the midsection.

21. The microstrip interconnector of claim 18, wherein the first section, the second section and the midsection are approximately equal in length.

22. The microstrip interconnector of claim 21, wherein the first section, the second section and the midsection are approximately equal in width.

23. The microstrip interconnector of claim 18, wherein the length of the first section, second section and midsection is approximately between 0.1 to 0.25 inch, the width of the first section, second section and midsection is approximately between 0.015 to 0.035 inch, and the thickness of the first section, second section and midsection is approximately between 0.001 to 0.005 inch.

24. The microstrip interconnector of claim 23, wherein the length of the first section, second section and midsection is approximately 0.180 inch, the width of the first section, second section and midsection is approximately 0.0225 inch, and the thickness of the first section, second section and midsection is approximately 0.003 inch.

25. The microstrip interconnector of claim 18, wherein the serpentine spring conductor further includes:
  at least a first layer and a second layer, the first layer joined to the dielectric layer, the first layer having a first geometry; and
  the second layer having a middle portion matching the first geometry, the middle portion of the second layer joined in alignment to the first layer to provide the midsection, the second layer further providing the first section and second section.

26. The microstrip interconnector of claim 18, further including a first layer having a first geometry, the first layer joined to the dielectric layer, the midsection of the serpentine spring conductor matching the first geometry, the midsection of the serpentine spring conductor joined in alignment to the first layer.

27. A microstrip interconnector for providing a solderless connection, comprising:
  a ground plane layer;
  a dielectric layer coupled to the ground plane layer;
  an S-shaped spring conductor having a first rising arm, a second rising arm and a midsection therebetween, the S-shaped spring conductor having at least a first layer and a second layer;
    the first layer joined to the dielectric layer, the first layer having a first geometry; and
    the second layer having a middle portion matching the first geometry, the middle portion of the second layer joined in alignment to the first layer opposite from the dielectric layer,
    the second layer further providing the first rising arm and the second rising arm, each arm having a distal end, the first arm providing a first contact proximate to the distal end of the first arm, the second arm providing a second contact proximate to the distal end of the second arm;
    wherein the first and second arms are parallel and extend in opposite directions; and
  wherein the ground plane layer, the dielectric layer and the S-shaped spring conductor cooperatively interact to provide a matched impedance path from the first contact to the second contact.

28. The microstrip interconnector of claim 27, wherein the first rising arm, the second rising arm and the midsection are approximately equal in length.

29. The microstrip interconnector of claim 28, wherein the first rising arm, the second rising arm and the midsection are approximately equal in width.

30. The microstrip interconnector of claim 27, wherein the length of the first rising arm, the second rising arm and the midsection is approximately between 0.1 to 0.25 inch, the width of the first rising arm, the second rising arm and the midsection is approximately between 0.015 to 0.035 inch, and the thickness of the first rising arm, the second rising arm and the midsection is approximately between 0.001 to 0.005 inch.

31. The microstrip interconnector of claim 30, wherein the length of the first rising arm, the second rising arm and the midsection is approximately 0.180 inch, the width of the first rising arm, the second rising arm and the midsection is approximately 0.0225 inch, and the thickness of the first rising arm, the second rising arm and the midsection is approximately 0.003 inch.

32. The microstrip interconnector of claim 27, where the first arm and second arm are parallel to the midsection.

33. The microstrip interconnector of claim 27, where the first arm and second arm are transverse to the midsection.

* * * * *